United States Patent [19]
Hingarh et al.

[11] Patent Number: 5,111,276
[45] Date of Patent: May 5, 1992

[54] THICK BUS METALLIZATION INTERCONNECT STRUCTURE TO REDUCE BUS AREA

[75] Inventors: Hemraj Hingarh, Saratoga; Andres D. Asuncion, Sunnyvale; Michael Thomas, Cupertino; Robert Brown, Palo Alto, all of Calif.

[73] Assignee: National Semiconductor Corp., Santa Clara, Calif.

[21] Appl. No.: 617,426

[22] Filed: Nov. 19, 1990

Related U.S. Application Data

[63] Continuation of Ser. No. 336,598, Apr. 10, 1989, abandoned, which is a continuation of Ser. No. 65,659, Jun. 22, 1987, abandoned, which is a continuation of Ser. No. 714,132, Mar. 19, 1985, abandoned.

[51] Int. Cl.⁵ .................... H01L 23/48; H01L 29/46; H01L 29/54
[52] U.S. Cl. ...................... 357/71; 357/67; 357/69
[58] Field of Search ............ 357/67, 71, 675, 715, 357/45, 69

[56] References Cited

U.S. PATENT DOCUMENTS

| | | | |
|---|---|---|---|
| 3,950,233 | 4/1976 | Rosvold | 357/71 S |
| 4,017,890 | 4/1977 | Howard et al. | 357/68 |
| 4,151,546 | 4/1979 | Kawagai et al. | |
| 4,166,279 | 8/1979 | Gangulee et al. | 357/65 |
| 4,206,472 | 6/1980 | Chu et al. | 357/71 S |
| 4,267,012 | 5/1981 | Pierce et al. | 357/71 |
| 4,569,122 | 2/1986 | Chan | 357/71 S |
| 4,618,878 | 10/1986 | Aoyama et al. | 357/71 |
| 4,733,289 | 3/1988 | Tsurumaru | 357/71 R |
| 4,774,559 | 9/1988 | Culican et al. | 357/71 R |
| 4,841,354 | 6/1989 | Inaba | 357/71 |

FOREIGN PATENT DOCUMENTS

| | | |
|---|---|---|
| 0161981 | 11/1915 | European Pat. Off. |
| 82/01102 | 9/1980 | World Int. Prop. O. |
| 8201102 | 4/1982 | World Int. Prop. O. ............ 357/71 |

OTHER PUBLICATIONS

Agarwala et al., "Dependence of Electromigration-Induced Failure Time on Length and Width of Aluminum Thin Film Conductors", *Journal of Applied Physics*, vol. 41, No. 10, Sep. 1978, pp. 3954-3960.

Patent Abstracts of Japan, vol. 7, No. 94 (E-171), Apr. 20, 1983, & JP-A-58 18941 (Nippon Denki) 03-02-1983.

Extended Abstracts, vol. 84, No. 2, 1984, p. 756, Abstract No. 517, "Etch Barrier Properties of LPCVD Tungsten", J. M. De Blase et al.

IBM Components Division, 13 Mar. 1970, final form 29 Apr. 1970, "Dependence of Electromigration-Induced Failure Time In Length and Width of Aluminum Thin-Film Conductors", Agarwala, Attardo and Ingraham.

*Primary Examiner*—Andrew J. James
*Assistant Examiner*—Ngan Van Ngo
*Attorney, Agent, or Firm*—Irving S. Rappaport; William H. Murray; Frank M. Linguiti

[57] ABSTRACT

There is disclosed a structure for self aligned and non-self aligned power and ground buses and interconnects for integrated circuits which are thicker than normal conductors. This enables them to withstand higher current densities without adverse electromigration effects. There is also disclosed a method for making such structures.

16 Claims, 7 Drawing Sheets

DOUBLE 2nd METAL (D2M)

DOUBLE 2nd METAL (D2M)

FIGURE 4A

DOUBLE 2nd METAL (D2M)

FIGURE 4B

DOUBLE 2nd METAL (D2M)

FIGURE 4C

DOUBLE 2nd METAL (D2M)

DOUBLE 1st METAL (DIM)

DOUBLE 1st METAL

FIGURE 10

DOUBLE 2nd METAL (D2M)

FIGURE 11

THICK BUS METALLIZATION INTERCONNECT STRUCTURE TO REDUCE BUS AREA

This is a continuation of copending application Ser. No. 07/336,598 filed on Apr. 10, 1989 now abandoned, which is a continuation of application Ser. No. 065,659 filed on Jun. 22, 1987, now abandoned, which is a continuation of application Ser. No. 06/714,132 filed on Mar. 19, 1989 now abandoned.

BACKGROUND OF THE INVENTION

1. Field of the Invention

The subject invention relates generally to large-scale electronic circuit integration technology, and more particularly to an improved power busing scheme for large-scale integrated semiconductor chips.

2. Description of the Prior Art

The tremendous increase in the number of circuit devices such as transistors which can be fabricated on a given semiconductor substrate or "chip" has been a driving force behind the revolutionary advances in and availability of computers and other electronic products. Device density has been increased to the point where the electrical leads or buses used to supply power to the devices occupy an increasingly large share of the chip, reducing the area available for electronic devices.

Present bipolar VLSI chips typically employ an orthogonal bus scheme in which at least 30-40% of the chip area is occupied by the power buses. The power bus size is affected by two factors: (a) the electromigration limit, and (b) the maximum voltage drop tolerated along the bus by the circuit which depends on the technology used to fabricate the devices. With respect to the first factor, as current density increases, aluminum atoms in a conductor are swept into the negative charge stream. This phenomenon may result in deleterious localized heating or open circuits as the concentration of aluminum atoms is locally depleted. With respect to the second factor, the maximum voltage (IR) drop tolerable is that level at which erroneous circuit operation may occur. Erroneous operation may occur because IR drops in buses can slow charging of output capacitances, and can cause improper triggering or activation of devices. Inordinate power consumption and chip heating can result from partial activation of devices which should be in an "off" state.

The busing scheme must also cope with current surges, a particular problem in CMOS designs. The foregoing factors place severe constraints on a bus design, particularly on cross-sectional bus width, which affects current density and electromigration.

Power hungry bipolar technologies such as ECL and integrated injection logic cause aggravation of the above mentioned problems as device density on a single die increases. The higher current densities in more dense circuits cause increased problems with electromigration and IR voltage drop. To alleviate these problems, several things can be done. Among them is the option to decrease current density. One way to do that is to increase the cross sectional area of the bus. However, it is undesirable for the power buses to consume substantial portions of the chip area If more area is consumed by buses, there is less useable chip area upon which to build devices.

There is yet another aspect of the problem not heretofore mentioned. As device size is decreased, the constraints on bus design become more acute. For example, a smaller transistor cannot charge a capacitance as rapidly. Since the leads (e.g., wires) being driven by these smaller VLSI transistors are just as long or longer than those used with physically larger transistors, the parasitic capacitance remains the same, and desired logic levels may take too long to be reached, resulting in erroneous operation or requiring slower clocking rates. Wider buses to handle increased current density have more parasitic capacitance because of greater area of one "plate" of the parasitic capacitor. Therefore wider buses aggravate the problem that was becoming worse by the on-going trend to reduce transistor size.

The response of the prior art to these design limits on device density has been to add additional layers of interconnecting metallization, i.e., third layer and fourth layer metallizations, each separated from the preceding layers by dielectric. Each layer of metallization is of a common thickness. Such schemes entail increased process complexity, requiring two to four additional masks and all the associated steps. Further, each additional mask causes an appreciable reduction in yield. Morever, the full potential of extra layers of metallization cannot be always realized because of the larger vertical connection or "via" required to interconnect the first metallization layer to the third layer through the second and other subsequent layers. The larger vias occupy area which could otherwise be devoted to devices.

SUMMARY OF THE INVENTION

It is therefore an object of the invention to provide an improved structure for power busing and interconnects in a large-scale integrated circuit.

It is another object of the invention to increase the space available for circuit devices on the chip, thereby increasing overall device density.

It is still another object of the invention to provide a power busing structure which can be readily manufactured.

These and other objects are achieved according to the invention by creating thick conductors for the main power-carrying buses of the integrated circuit. The thicker conductor has sufficient cross-sectional area to prevent electromigration problems yet does not consume excessive amounts of surface area on the chip thereby removing area which could be used for devices.

In the preferred embodiment, this result is achieved by depositing a self-aligned second layer of metal directly to the first layer metal and defining the main buses out of this composite metal layer to achieve a thick, and narrow main bus structure. The main bus is wider than the interconnects, but of significantly less width than in the prior art for the same or greater cross-sectional area. In the preferred embodiment, the first and second layer metals are of different materials which are subject to a self-aligning fabrication process using first and second etchants, each of which removes only one of the materials. The first layer material is aluminum, and the second layer could be tungsten or it could be silicide in the preferred embodiment. These two layers can also be reversed.

Another embodiment uses a single, extra thick layer of conductor which is more narrow than in prior art integrated circuits.

As a result of the subject invention, significant increases in device density are possible.

BRIEF DESCRIPTION OF THE DRAWINGS

The invention will be better understood when considered in conjunction with the drawings of which.

DETAILED DESCRIPTION OF THE PREFERRED EMBODIMENT OF THE INVENTION

Figure 1:
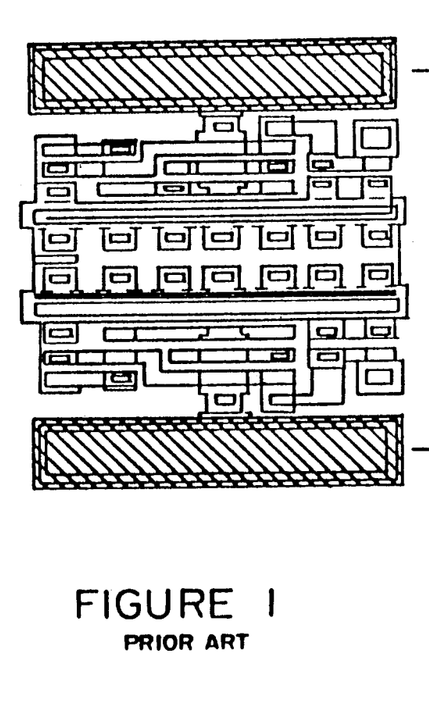
FIGS. 1 and 2 are typical views of a large-scale integrated circuit bus structure, FIG. 2 illustrating the relative reduction in bus size resulting from application of the invention over the prior art represented by FIG. 1.
Figure 2:
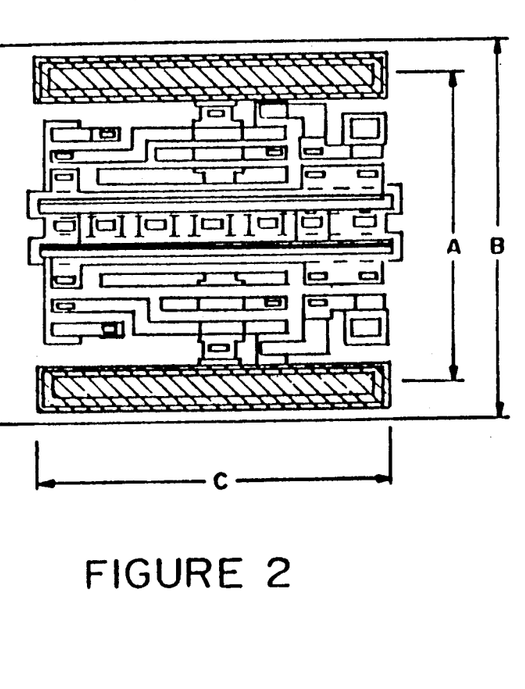
Figure 3:
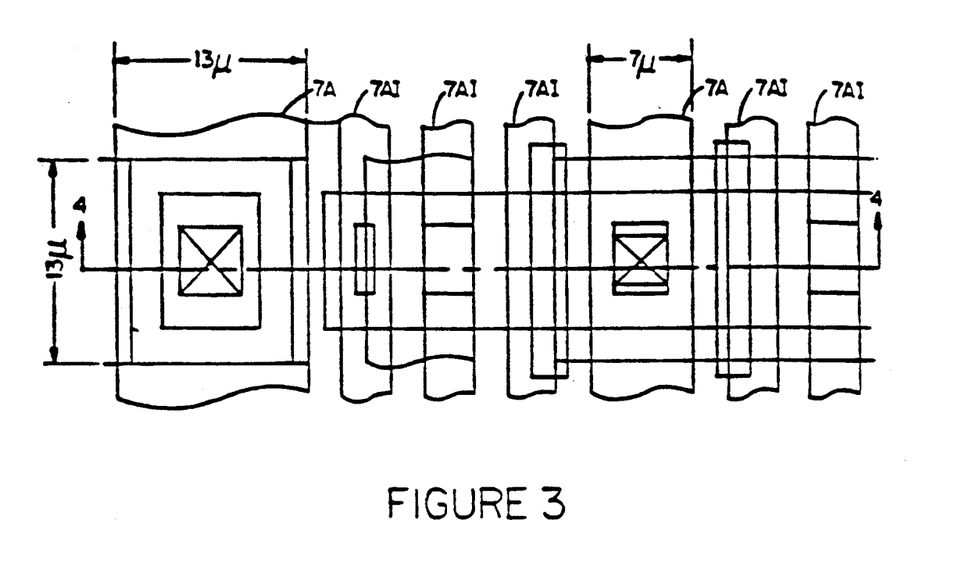
FIG. 3 is a top view of the first layer of the metallization structure according to a first embodiment of the invention.

A first embodiment of the invention is illustrated in FIGS. 3 and 4. The cross-section of FIG. 4A is taken at 4—4 of FIG. 3 after the layers 9A and 9B have been added (FIG. 3 does not show layers 9A and 9B for clarity purposes) and illustrates device layers on a substrate overlaid by a metallization structure consisting of a power bus 45 and ground bus 43 and interconnect lines 60. The device layers include a P-substrate 11, an N+ layer 13, N− epi layers 15,17, P− base layer 18, P+ layers 19, 21, 23, 25 and N+ layers 27, 29, 31. These layers and device structures are meant to be illustrative only, and are not part of the invention.

Figure 4A:
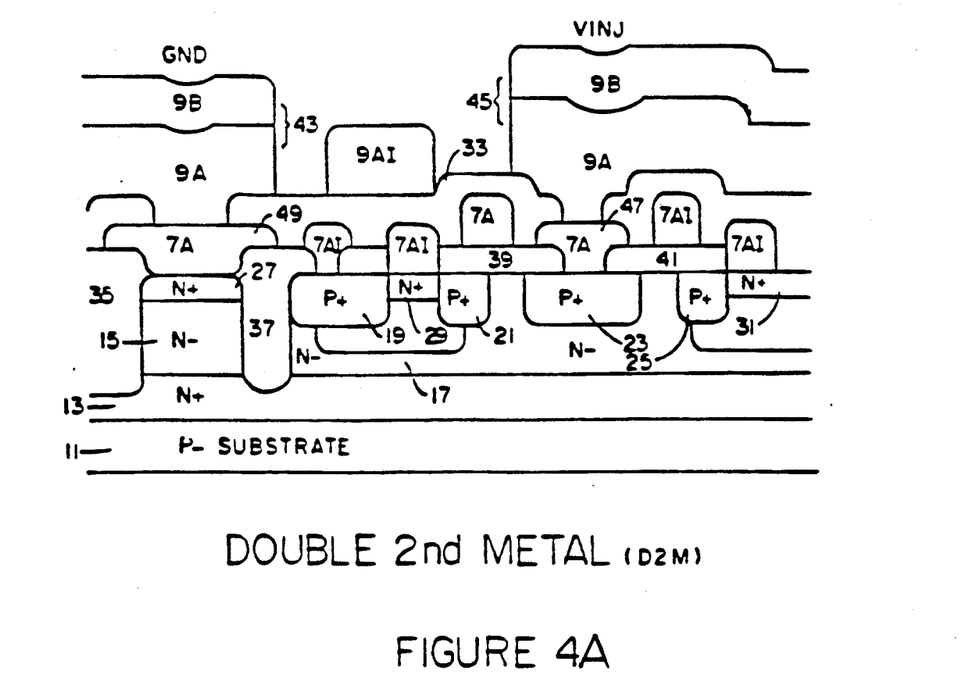
FIG. 4A is a sectional view of the first and second metal layers in an integrated circuit structure employing a double metallization structure on the second metallization layer of a chip and with interconnect lines of a single layer thickness on the second metal layer.

The metallization structure includes a first metal layer including a layer 7A and first layer interconnects branches 7AI which are electrically connected to layer 7A. These layers 7A, 7AI are of the same thickness. This thickness can be conventional. The metallization structure further includes a second composite conductive layer comprised of layers 9A and 9B defining two power bus structures 43, 45, and a single layer thickness second layer interconnect 9AI. A dielectric layer 33 lies between the second layer interconnect 9AI and the first layer interconnect 7AI. Additional dielectric areas include areas designated 35, 37, 39, 41. All of the foregoing structures are formed by conventional methods which are well known to those skilled in the art. The layers 9A and 9B are formed in separate masking and etching steps, so proper alignment of these masks is important. Misalignment of layers 9A and 9B should not exceed the maximum mask alignment tolerance of the process.

The second layer ground and power bus structures 43, 45, because of their first and second strata 9A, 9B, provide for a thicker bus structure having a lesser width than bus structures of the prior art but having the same cross-sectional are as prior buses. This means buses 43 and 45 can carry the same amount of current as the wider buses of prior art structures without suffering from electromigration or IR drop problems, but they consume less surface area on the chip since they are vertically integrated into the device structure.

A metal layer comprising conductors 7A and 7AI is deposited to form the first metal layer inteconnect pattern on the device. The 7AI conductor is in electrical contact with the 7A conductor and acts as an interconnect line to other devices. The 7A conductor is in electrical contact with the power bus to be defined above it in the second and third metal layers designated 9A and 9B. Following definition of the first metal layer, a layer 33 of silicon dioxide is deposited. Following deposit of the silicon dioxide layer 33, the second and third metal layers 9A and 9B are deposited in a single deposition sequence. The advantage of this is that a normal thickness of photoresist can be used on the 9A layer to define the bus main body and the interconnects. This normal thickness of photoresist will not degrade the resolution of the photolithography process as thicker photoresist would. Thicker photoresist is needed on thicker conductive layers that must be defined by etching, because the etching attacks the photoresist. Thus, its thickness but must be large enough to last throughout the etch time during which the exposed material not covered by photoresist is etched. Thicker photoresist layers degrade resolution, and tend to force larger feature sizes. These problems do not exist in the embodiment of FIG. 4A.

Figure 4B:
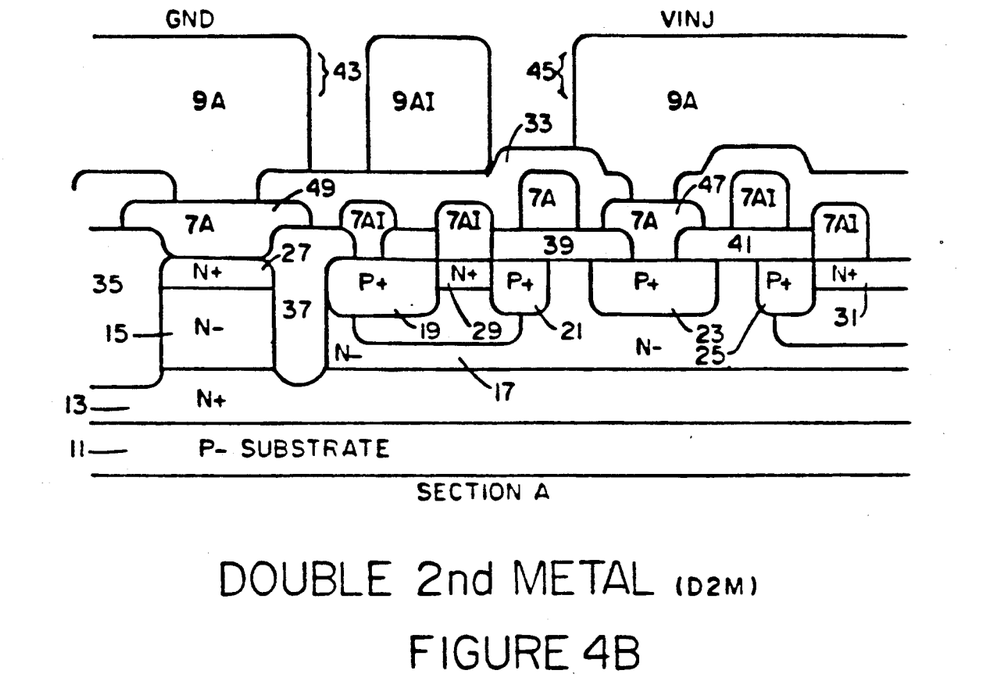
FIG. 4B is an alternative embodiment of the structure of FIG. 4A where the second metallization layer is thicker than prior art layers but is formed in one layer instead of two and with extra thick interconnect line thickness.

Alternatively, the layers 9A and 9B may be deposited in a single step of depositing and etch defining the second layer conductor at greater than the normal thickness but having a more narrow width as shown in FIG. 4B. The buses then will have the same or greater cross-sectional area as in the prior art but will be more narrow and thus will be able to carry increased current density without excessive electromigration endangering (the integrity of the device.

The advantage of the structure of FIG. 4B is that there is no alignment difficulty in aligning the mask for defining the metal layer 9B with the previously defined metal layer 9A, and there are fewer process steps. However, the interconnect lines 9AI must also be formed with thicker metal since they are formed in the same second conductor layer deposition as the deposition which formed layer 9A. A thicker conductive layer means also that the photoresist layer needed to define the busses 43 and 45 in layer 9A and the interconnects 9AI must be thicker so as to be able to withstand the longer etch times needed to etch through the thicker conductor layer 9A. This thicker resist must be thick enough to withstand, at the edge of the wafer, the long etch times required by die in the middle of the wafer because of the uneven etch rates in plasma etching between die in the middle of the wafer and die at the edge of the wafer. Thicker resists however degrade the resolution of the photolithography process, so the interconnect lines 9AI must be defined with an aspect ratio or feature size which is smaller than can be obtained with the resolution limits established by the thicker resist coatings. Those skilled in the art will appreciate that the resolution limits, resist coating thickness, feature sizes, and conductor layer thickness parameters depend upon the current density that the particular design must handle, the design rules and resolution capability of the particular photolithography system used.

As briefly mentioned above, the plasma etching process does not etch at a uniform rate across the surface of a wafer. This creates special problems with the embodiment of FIG. 4B which can adversely affect yield unless these etching problems are prevented. Plasma etching usually etches at a faster rate on the periphery of the wafer than in the middle. Thus etching of unwanted metal in the second conductor layer 9A for die on the periphery of the wafer may be completed whereas die in the middle area of the wafer may still have unwanted metal in the layer 9A which remains to be etched. Because the etching must continue until the etch is complete in these middle die, the etching also must continue on the outer die. This continued etching on the outer die attacks the structures underneath the second metal layer and can render the circuits unuseable on these outer die thereby decreasing yield. Another problem caused by the over etching at the periphery of the wafer is that the plasma etching process can become isotropic after the field is completely cleared of second layer metal. This can lead to undesirable undercutting and a loss in the useful cross section of the second layer metal patterns.

Figure 4C:
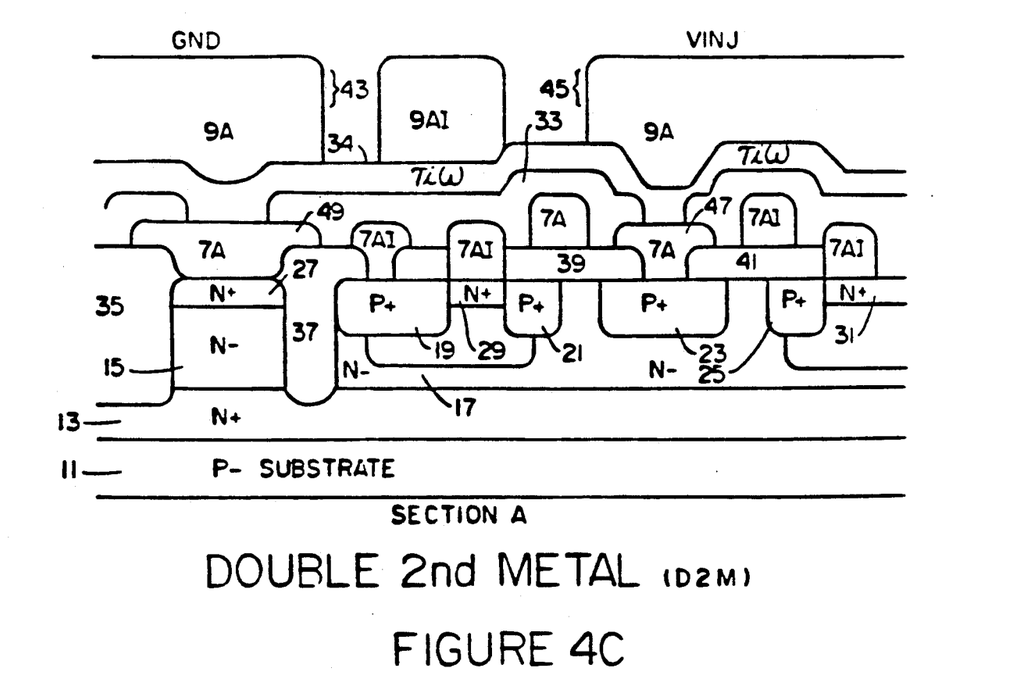
FIG. 4C illustrates an intermediate structure for an alternative embodiment of a single, extra thick conductive layer on the second metallization layer and utilizing an etch protective barrier the final structure of which is illustrated in FIG. 4D.

One way to prevent this from occurring is to place a barrier layer of a metal such as titanium-tungsten over the entire surface of each die and under the second metal layer 9A. An intermediate stage of this embodiment is illustrated in FIG. 4C. In this embodiment, a thin etch barrier layer 34 of, for example, titanium-tungsten alloy is deposited by any conventional method over the entire surface of the die prior to deposition of the second conductor layer 9A. In the preferred embodiment, the second conductor layer 9A is aluminum. This barrier layer 34 must be thick enough to withstand the etching during the plasma etch time on the die on the periphery of the wafer. Typically the barrier layer would be about 1500 angstroms thick, but this thickness is not critical. It need only have sufficient thickness to withstand the etching.

The etch barrier layer 34 serves to stop further etching by the plasma etch flux any place on the die where the etching goes all the way through the second conductor layer 9A earlier than in other places on the same die or the same wafer. Thus the etch barrier layer 34 must be some material that etches appreciably slower than the material of the second conductor layer 9A or not at all in the type of plasma used to etch the second conductor layer 9A. Titanium-tungsten alloy (10% titanium by weight, 90% tungsten by weight) is one such composition which could be used. Others would be a sandwich structure of a layer of titanium nearest the substrate covered by a layer of tungsten. The preferred embodiment is the sandwich structure. A chlorine bearing plasma etch would not rapidly attack a titanium-tungsten barrier layer but would attack aluminum and could be used to define the buses and interconnects in the aluminum.

Figure 4D:
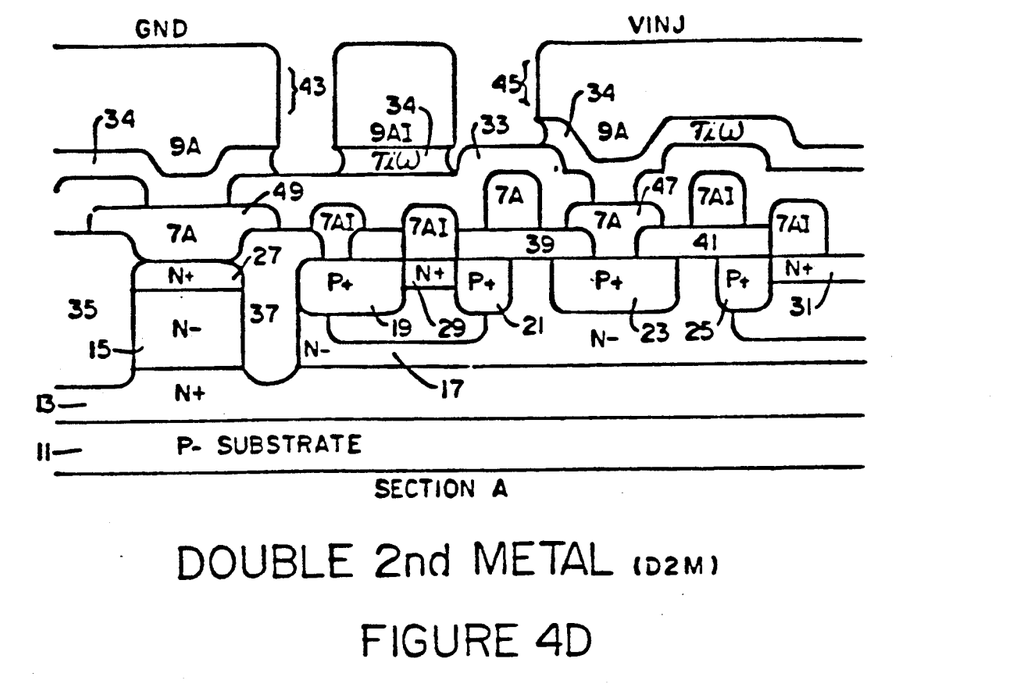
FIG. 4D illustrates the final structure of the FIG. 4C alternative embodiment of a single, extra thick conductive layer on the second metallization layer and utilizing an etch protective barrier.

After etching is completed to form the second conductive layer buses and interconnect lines, the remaining, exposed metal of the etch barrier layer 34 may be removed by a wet etch step using an etch solution that will selectively attack the barrier layer 34 but not the second conductor layer 9A. For aluminum as the second conductor layer 9A and a titanium-tungsten barrier layer 34, such an etchant solution would be one part by volume of ammonium hydroxide ($NH_4OH$) and three parts hydrogen peroxide ($H_2O_2$). The undercut that would be caused by the wet etch would not be a problem since the thickness of the etch barrier layer 34 is small thereby limiting the amount of undercut. Further, most of the current in the busses and interconnects would flow in the second conductor layer 9A because of its lower resistivity compared to that of the etch barrier layer metal 34. The completed structure after the wet etch step is shown in FIG. 4D.

Figure 5:
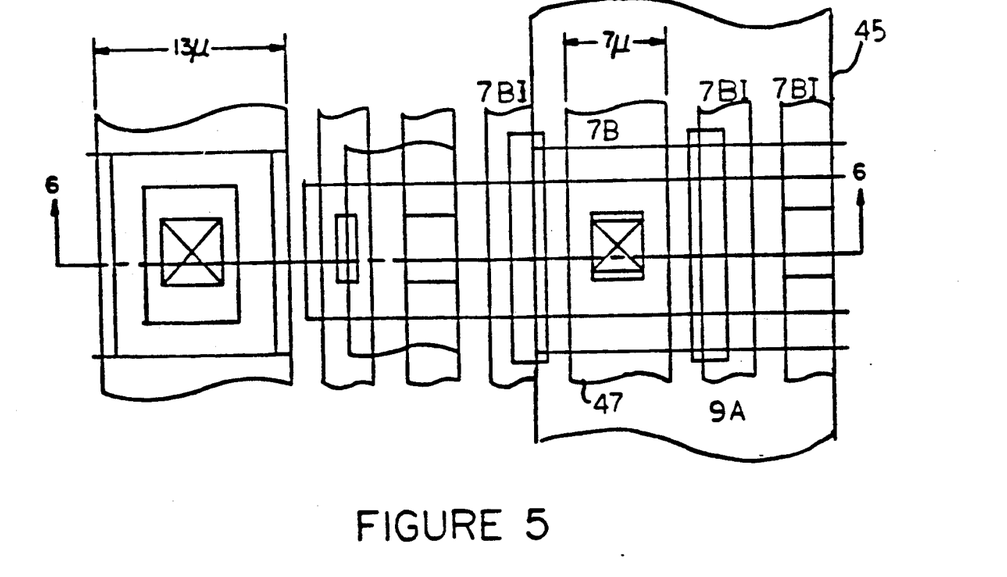
FIG. 5 is a top view of a second embodiment of a metallization structure according to the invention.
Figure 6:
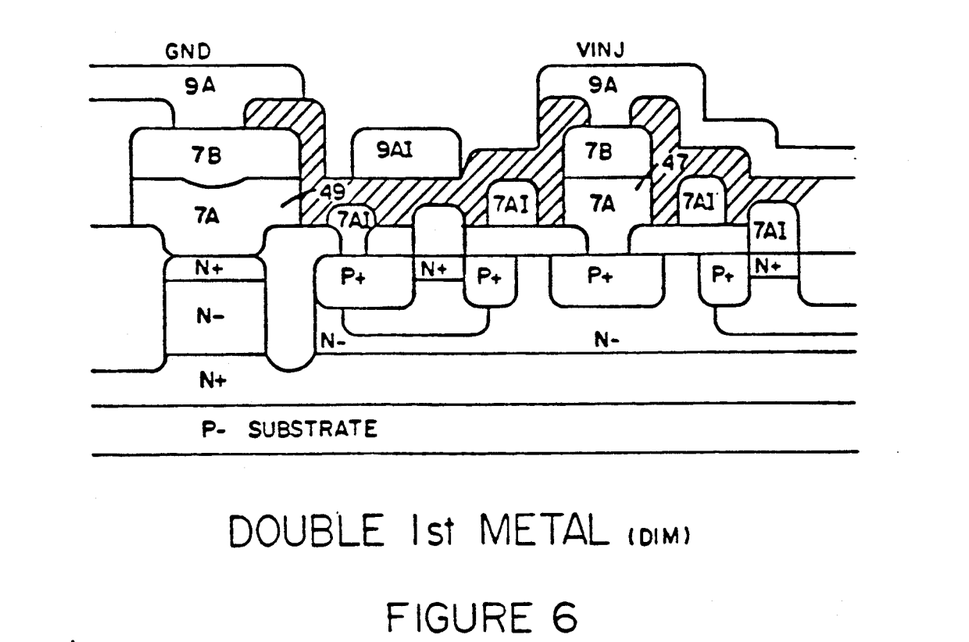
FIG. 6 is a sectional view of an integrated circuit employing the multiple layer sandwich metallization structure of an alternative embodiment of the invention on the first metallization layer of a two layer IC and using single layer thickness interconnect lines.

The second embodiment of FIGS. 5 and 6 utilizes the thicker bus conductor on the first layer of a dual conductive layer IC and utilizes single layer thick interconnects. The embodiment of FIGS. 5 and 6 uses the same semiconductor substrate structure as FIGS. 4 and 5. In this embodiment, a second conductor stratum 7B is selectively added on the ground and injection main power buses 47, 49. Mask registration must accurately place power bus stratum 7B on layer 7A. Of course the same considerations discussed above with respect to the second layer metal 9A apply equally to the embodiment of the invention having extra thick first conductive layer buses. Accordingly, the embodiment of FIG. 6 has, itself, two alternative embodiments analogous respectively to the embodiments show in FIGS. 4B and 4D.

A preferred process for forming self-aligned power bus structures having a different thickness than the surrounding digital interconnect lines will now be described. This process employs a dual conductor structure which yields two disimilar conductive layers in electrical contact with each other and in self-alignment such that only one mask need be used to define them.

Figure 7:
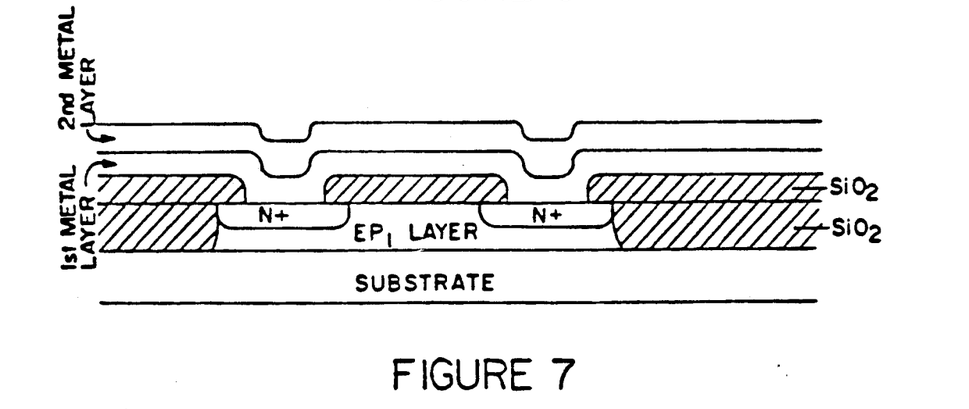
FIGS. 7-9 illustrate a process for fabrication of an exemplary, simplified, self aligned metallization structure according to the preferred embodiment of the invention.

The process is outlined as follows with respect to FIGS. 7–10. As shown in FIG. 7, a dual conductor layered structure of two dissimilar conductor layers 50 and 52 is first deposited on a wafer at the contact mask stage. For example, the first metal layer 50 may be aluminum with a typical thicknesses of 5,000 angstroms. Alternatively, the first layer 50 may be tungsten with a typical thickness of from 7,500 to 10,000 angstroms.

The second layer 52 must have a substantially different etch rate than the first layer 50. For example, the first layer could be aluminum and the second layer could be tungsten or silicide. Conversely, the first and second layers could be in the reverse order It is only necessary that the two conductive materials be such that two etching processes exist one of which etches only one of the materials and not the second material while the second etching process etches only the second material and not the first. The reason for this will become apparent from the discussion below.

Figure 8:
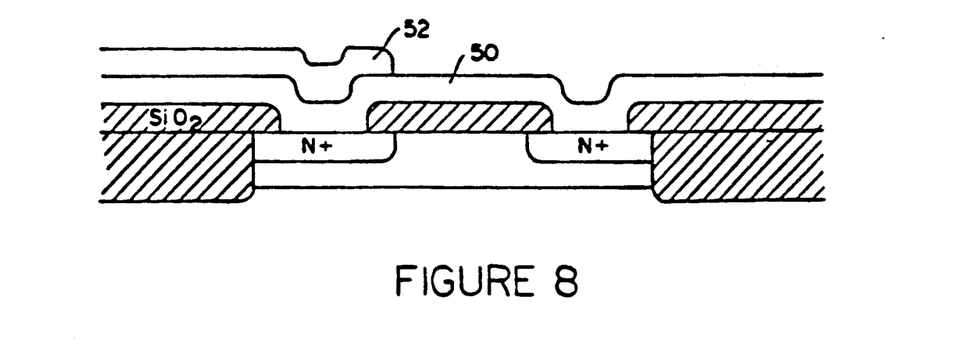

Assuming that the first layer 50 is aluminum and that the second layer 52 is tungsten, photoresist is deposited and defined so as to protect the areas where the buses and interconnects are to be formed. Next a fluorine bearing plasma etch process is used to etch away all the tungsten layer 52 except those portions protected by the photoresist. Those skilled in the art will appreciate the type of photoresist to be used and the method of depositing, exposing, developing and dissolving the undeveloped resist to define an area of the layer 52 to be protected from the fluorine plasma. Those skilled in the art will appreciate that any other etching techniques may be used also if they attack the only the second conductor layer 52 while not attacking the first layer metal 50. That is, the unwanted tungsten is etched away, exposing the underlying aluminum in the layer 50. The aluminum is not attacked by the fluorine plasma and therefore acts as an etch stop. The photoresist employed in masking for the fluorine etch is then removed. FIG. 8 illustrates the wafer structure at this stage.

The wafer is then remasked after deposition of a photoresist to define the interconnects in the aluminum layer 50 if interconnects having only the thickness of the aluminum layer are desired. If dual thickness interconnects are desired, they would have been defined in the earlier photoresist deposit and definition steps to protect the areas in the layer 52 that are to form the second layer of the interconnect line. If single layer thickness interconnects are desired, then photoresist is deposited and developed using another mask so as to define only the interconnect lines 54 to be defined in the first layer conductor 50 connecting the power bus 56 to various nodes in the circuit. This mask does not have to be aligned with the mask registration marks for the mask used to define the power buses since the previously defined tungsten or silicide lines will serve as a mask to protect from the second etch those areas of aluminum or other conductor which are to form the first layer in the two layers of the extra thick bus structure. Next the aluminum not protected by either the top layer conductor 52 still remaining or the photoresist just deposited and defined is etched away with a chlorine bearing plasma. Because of the material selection for the second conductor layer, the second layer conductor 52 serves to mask the first layer conductor 50 from any etching since the second layer conductor 52 is impervious to the etch plasma used to etch the first layer conductor 50.

Thus a self aligned thick bus structure is obtained which can have a more narrow width than previously possible. Basically, the desired dimensions of the power bus and interconnects are determined by determining the current drawn in the application the structure is to be used in, and then determining the necessary cross sectional area after determining the maximum current density that the bus conductor can withstand without electromigration or IR drop problems. Once this cross sectional area is determined, and the maximum surface area over the substrate that can be used by the bus is determined, then the thickness of the bus can be determined.

Figure 9:
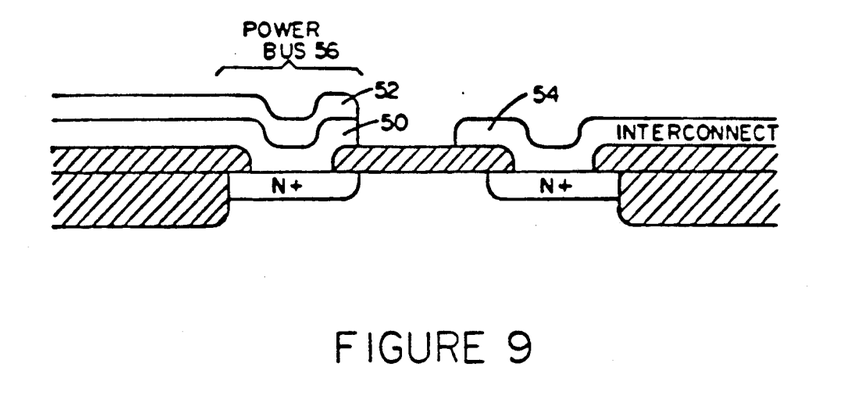

The self aligned structure after this first layer etch is shown in FIG. 9. Other processing steps may then be carried out to complete the device. All of the above processing steps can be accomplished using conventional techniques to perform each step. Such techniques are well known in the art, and are described in, inter alia, "Integrated Circuit Fabrication Technology" by David J. Elliott, Library of Congress number TK 7874.E49 and "Semiconductor and Integrated Circuit Fabrication Techniques" by Peter Gise and Richard Blachard, Library of Congress number TK7871.85.F298 both of which are hereby incorporated by reference.

Figure 10:
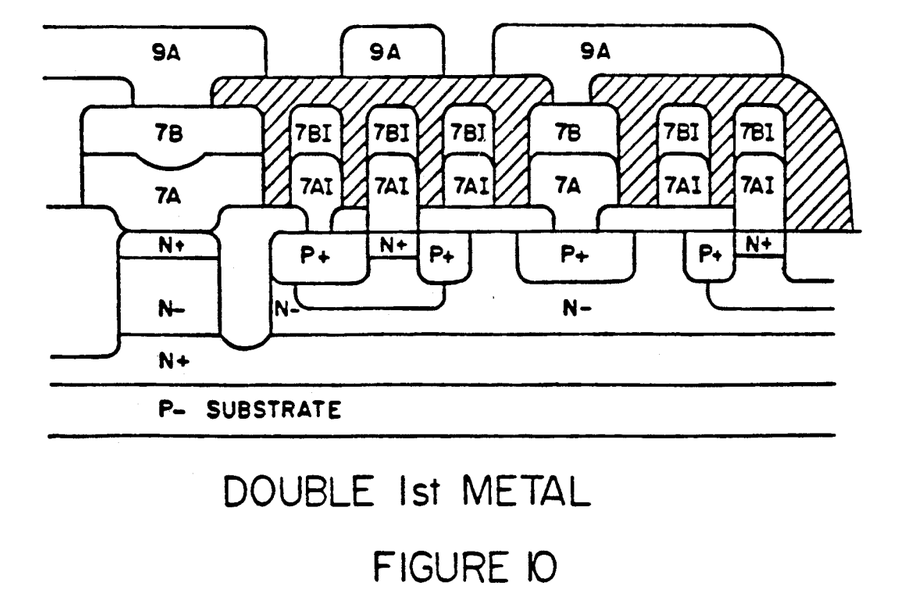
FIG. 10 illustrates a sectional view of a self aligned, extra thick integrated circuit metallization structure according to the preferred embodiment using two dissimilar conductive materials on the first metallization layer and using a double layer interconnect line.

With this self-aligned double thick metal process, two alternatives are available (1) to define all of the interconnect and bus lines at the same thickness or (2) to have the interconnect lines defined in the first layer conductor only and completely isolated from the second level conductor of the bus lines with a thick dielectric in order to reduce capacitive coupling between the two metal layers. The first alternative—a self aligned, double thick first layer embodiment—is shown in FIG. 10. In FIG. 10, the power buses are denominated by first strata conductor 7A in the first conductor layer and second strata conductor 7B also of the first conductor layer, where both strata are in electrical contact with each other. The interconnect lines are designated by first strata conductor 7AI and second strata conductor 7BI also in electrical contact with other. The structure of FIG. 10 can be formed by the self aligned process described with reference to FIGS. 7-9 by simultaneously defining both the buses and the interconnects with one mask at the second layer, i.e., the tungsten or silicide layer 52. Thereafter, the second layer 52 is used as the mask for the first layer 50.

Figure 11:
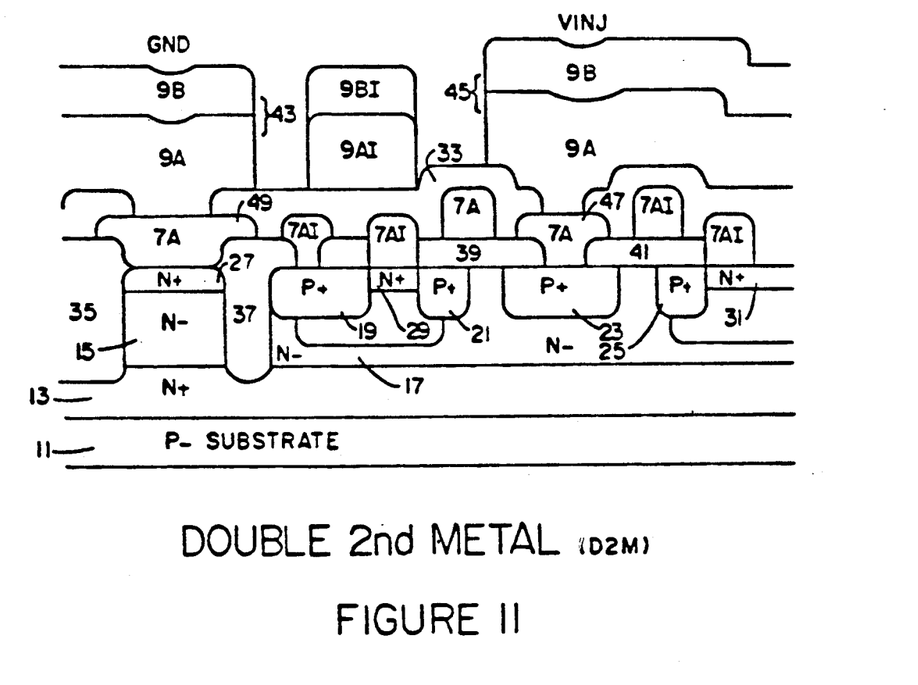
FIG. 11 illustrates a sectional view of a self aligned integrated circuit structure according to the preferred embodiment using two dissimilar conductive materials on the second metallization layer and using double layer interconnect lines.

FIG. 11 shows another self aligned embodiment with double thick second conductor layer buses, i.e., 9A and 9B, and double thick interconnects 9AI and 9BI. This structure may be made using the process defined in FIGS. 7-9.

It must be kept in mind that the relative resistivity of tungsten is around 10 micro-ohm-cm and that of aluminum alloys is around 3.2 micro-ohm-cm. Reports have shown that, for thicknesses above 4500 angstroms, tungsten resistance drops towards its theoretical value of 5.3 micro-ohm-cm. These considerations are relevant to the fraction of current carried by the dual layer conductor and the selection of the relative thicknesses of the respective metals employed.

The embodiments of FIGS. 10 and 11 have certain advantages which cause the inventors to presently consider them the preferred embodiments. First, the second conductor layer of the interconnects 7BI (or 9BI) can be designed to carry one-third of the current load. This reduces the current density in and the electromigration problem faced by aluminum first layer conductor 7AI (or 9AI) interconnects to the point where copper need not be put in the aluminum conductors to prevent electromigration. This renders the aluminum layer 7AI (or 9AI) easier to etch by eliminating undesirable compounds of copper which may form in the etching process. The embodiments of FIGS. 10 and 11 also require one less mask than that of the non-self-aligned embodiments and may provide faster switching speeds in some architectures. The embodiments of FIGS. 10 and 11 tend to minimize capacitance between the power bus and interconnect lines.

As the foregoing discussion indicates, various modifications and adaptations of the disclosed embodiments may be made without departing from the scope and spirit of the invention. Therefore, it is to be understood that, within the scope of the appended claims, the invention may be practiced other than as specifically described herein.

What is claimed is:

1. A metallization structure for a horizontally extending power bus region and horizontally extending interconnect lines in an integrated circuit comprising:
a semiconductor substrate having circuit elements formed therein;
a conductive bus region;
horizontally extending conductive interconnect lines coupled to said circuit elements and to said power bus region for transmitting power from said power bus region to said circuit elements;
said horizontally extending power bus region and said horizontally extending interconnect lines being formed of a first horizontally extending conductive layer of a first predetermined thickness and insulated from said substrate except for the connections with said elements;
said power bus region further being formed of a second horizontally extending conductive layer disposed upon and in physical contact with an upper surface of and in electrical contact with selected portions of said first horizontally extending conductive layer, said second horizontally extending conductive layer having a second predetermined thickness; and,
said metallization structure thereby defining a power bus region with a thickness greater than the thickness of said interconnect lines wherein said first horizontally extending conductive layer is integral both to said interconnect lines and to said power bus region.

2. A structure as defined in claim 1 further comprising a third conductive layer interposed between said conductive power bus and said circuit elements formed on said substrate.

3. A structure as defined in claim 1 further comprising a third conductive layer formed above said power bus and in electrical contact with it.

4. A structure as defined in claim 1 wherein said first and second conductive layers of said power bus are self aligned such that there is never any mask registration error overlap between said first and second conductive layers of said power bus.

5. The structure of claim 4 wherein said first conductive layer is chosen from a first class of conductive materials which are subject to etching by a first etching process that will not etch the material of said second layer and said second conductive layer is chosen from a second class of conductive materials not subject to etching by the first etching process and which are subject to etching by a second etching process that will not etch the material of said first layer.

6. The structure of claim 5 wherein said first conductive layer is chosen from the group comprising aluminum, tungsten or silicide and said second layer is one of the other materials in this group which is not subject to etching by the process chosen to etch said first layer.

7. The structure of claim 5 wherein said first conductive layer is aluminum and the second conductive layer is tungsten.

8. The structure of claim 5 wherein said first conductive layer is aluminum and the second conductive layer is silicide.

9. The structure of claim 1 wherein said first conductive layer is chosen from a first class of conductive materials which are subject to etching by a first etching process that will not etch the material of said second layer and said second conductive layer is chosen from a second class of conductive materials not subject to etching by the first etching process and which are subject to etching by a second etching process that will not etch said first conductive layer.

10. The structure of claim 1 wherein said second layer forming said bus is deposited to have an upper surface higher above said substrate than the portions of the upper surface of said first layer forming said interconnect lines.

11. The structure of claim 10 wherein the portions of said first layer forming said interconnect lines and said bus are disposed substantially the same height above said substrate.

12. The structure of claim 1 further comprising a third conductive layer interposed between said conductive power bus and said circuit elements formed on said substrate.

13. The structure as defined in claim 1 further comprising a third conductive layer formed above said power bus and in electrical contact with it.

14. The structure of claim 1 wherein said first and second conductive layers of said power bus are self aligned such that there is never any mask registration error overlap at the edges of said first and second conductive layers of said power bus.

15. The structure of claim 4 wherein said first conductive layer is chosen from a first class of conductive materials which are subject to etching by a first plasma etching process that will not etch the material of said second layer and said second conductive material is chosen from a second class of conductive materials not subject to etching by the first plasma etching process and which are subject to etching by a second plasma etching process that will not etch the material of the first layer.

16. The structure of claim 1 wherein said first conductive layer is chosen from a first class of conductive materials which are subject to etching by a first plasma etching process that will not etch the material of said second layer and said second conductive layer is chosen from a second class of conductive materials not subject to etching by the first plasma etching process and which are subject to etching by a second plasma etching process that will not etch the first conductive layer.

* * * * *